(12) United States Patent
Vielemeyer et al.

(10) Patent No.: US 9,978,862 B2
(45) Date of Patent: May 22, 2018

(54) POWER TRANSISTOR WITH AT LEAST PARTIALLY INTEGRATED DRIVER STAGE

(71) Applicant: Infineon Technologies Austria AG, Villach (AT)

(72) Inventors: Martin Vielemeyer, Villach (AT); Walter Rieger, Arnoldstein (AT); Martin Pölzl, Ossiach (AT); Gerhard Nöbauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 720 days.

(21) Appl. No.: 13/873,769

(22) Filed: Apr. 30, 2013

(65) Prior Publication Data

US 2014/0319602 A1    Oct. 30, 2014

(51) Int. Cl.
*H01L 29/78*    (2006.01)
*H01L 29/66*    (2006.01)
(Continued)

(52) U.S. Cl.
CPC ...... *H01L 29/7827* (2013.01); *H01L 27/0207* (2013.01); *H01L 27/088* (2013.01);
(Continued)

(58) Field of Classification Search
CPC ............. H01L 29/0634; H01L 29/7825; H01L 29/7801; H01L 29/7802; H01L 29/0696;
(Continued)

(56) References Cited

U.S. PATENT DOCUMENTS 6,583,663 B1 * 6/2003 Disney ............... H01L 23/4824
                                                        327/565
6,806,533 B2   10/2004 Henninger et al.
(Continued)

FOREIGN PATENT DOCUMENTS

CN    101179226 A    5/2008
CN    101442302 A    5/2009
(Continued)

OTHER PUBLICATIONS

Yang et al. "NexFET Generation 2, New Way to Power." IEEE International Electron Devices Meeting (IEDM), Dec. 2011. pp. 26.1.1-26.1.4.
(Continued)

*Primary Examiner* — Hrayr A Sayadian
(74) *Attorney, Agent, or Firm* — Murphy, Bilak & Homiller, PLLC (57) ABSTRACT

A semiconductor die includes a semiconductor substrate having a first region and a second region isolated from the first region. A power transistor disposed in the first region of the semiconductor substrate has a gate, a source and a drain. A gate driver transistor disposed in the second region of the semiconductor substrate has a gate, a source and a drain. The gate driver transistor is electrically connected to the gate of the power transistor and operable to turn the power transistor off or on responsive to an externally-generated control signal applied to the gate of the gate driver transistor. A first contact pad is electrically connected to the source of the power transistor, and a second contact pad is electrically connected to the drain of the power transistor. A third contact pad is electrically connected to the gate of the gate driver transistor for receiving the externally-generated control signal.

24 Claims, 12 Drawing Sheets

(51) Int. Cl.
*H01L 27/02* (2006.01)
*H01L 27/088* (2006.01)
*H01L 27/092* (2006.01)
*H01L 29/40* (2006.01)
*H01L 29/417* (2006.01)
*H01L 29/10* (2006.01)
*H03K 17/04* (2006.01)

(52) U.S. Cl.
CPC ...... *H01L 27/092* (2013.01); *H01L 29/66477* (2013.01); *H01L 29/1087* (2013.01); *H01L 29/407* (2013.01); *H01L 29/41766* (2013.01); *H01L 29/78* (2013.01); *H01L 29/7813* (2013.01); *H01L 2924/0002* (2013.01); *H03K 17/04* (2013.01)

(58) Field of Classification Search
CPC ........... H01L 29/1095; H01L 29/41766; H01L 29/4236; H01L 29/4238; H01L 29/4232
USPC .................. 257/285, 287, E29.027, E29.066, 257/E29.121, E29.136, E29.257
See application file for complete search history.

(56) References Cited

U.S. PATENT DOCUMENTS

| | | |
|---|---|---|
| 7,449,777 B2 | 11/2008 | Deboy et al. |
| 7,495,419 B1 | 2/2009 | Ju |
| 8,193,559 B2 | 6/2012 | Haeberlen et al. |
| 2005/0173741 A1 | 8/2005 | Spring |
| 2006/0055384 A1 | 3/2006 | Jordan et al. |
| 2006/0273768 A1 | 12/2006 | Chen et al. |
| 2009/0065810 A1 | 3/2009 | Honea et al. |
| 2010/0066322 A1 | 3/2010 | Buethker |
| 2010/0327942 A1 | 12/2010 | Deboy |
| 2011/0074375 A1 | 3/2011 | Yang et al. |
| 2011/0148506 A1 | 6/2011 | Korec et al. |
| 2011/0241170 A1* | 10/2011 | Haeberlen et al. ............ 257/532 |
| 2011/0284869 A1 | 11/2011 | Briere |
| 2012/0127767 A1 | 5/2012 | Spits |
| 2012/0268091 A1* | 10/2012 | Takemae ............... H03K 17/164 323/272 |
| 2013/0033243 A1 | 2/2013 | Takemae |
| 2014/0049296 A1 | 2/2014 | Jeon et al. |
| 2014/0203288 A1 | 7/2014 | Hsiung |

FOREIGN PATENT DOCUMENTS

| | | |
|---|---|---|
| CN | 102184926 A | 9/2011 |
| CN | 102545559 A | 7/2012 |
| DE | 10214151 B4 | 4/2007 |
| DE | 102008056206 A1 | 5/2009 |

OTHER PUBLICATIONS

Yang, Boyi et al., "Design Considerations on Low Voltage Synchronous Power MOSFETs with Monolithically Integrated Gate Voltage Pull-down Circuitry", Proceedings of the 2012 24th International Symposium on Power Semiconductor Devices and ICs, Jun. 3-7, 2012, pp. 121-124.

* cited by examiner

POWER TRANSISTOR WITH AT LEAST PARTIALLY INTEGRATED DRIVER STAGE

TECHNICAL FIELD

The instant application relates to power transistors, and more particularly to the arrangement of power transistors and corresponding driver stages.

BACKGROUND

Buck converters are widely used for DC-DC conversion, and preferably have high efficiency. To achieve high efficiency, the high-side and low-side power transistors of the buck converter output stage must be switched very fast and use as little margin (i.e. dead time) as possible. However, when switching very fast, a voltage is induced on the gate of at least one of the power transistors. Such an induced gate voltage leads to a turn-on of the device, cross-conduction and very high losses unless the dead time is very long.

Buck converters are conventionally packaged with the power transistors of the output stage disposed in one die (chip) and the driver on a separate die, or both the power transistors and the driver fully integrated on a single die. In the case of separate dies, the inductance between the driver and the gate of the power transistor is so high that the gate voltage cannot be perfectly controlled due to the dynamic voltage drop over the series parasitic resistance and inductance. This in turn induces a voltage at the gate of at least one of the power transistors unless the dead time is increased, resulting in reduced efficiency.

In the fully integrated case, the power transistors of the output stage are integrated with the driver on a single die. With this approach, the design of the power transistors is limited to the driver technology, which offers limited breakdown voltage. The maximum blocking voltage of the low-side and high-side transistors of the buck converter output stage are limited with such an approach. For example, Rdson (on-state resistance) and FOM (figure of merit) of the power transistors is very bad since only lateral transistors are available with conventional fully integrated approaches. The maximum efficiency of the fully integrated technique is therefore also limited.

SUMMARY

Embodiments described herein monolithically integrate at least the pull-down transistor of a driver final stage with power transistors of a DC-DC converter output stage on the same die, with other parts of the driver being disposed on a separate die. At least this pull-down transistor can be removed from the driver die, eliminating parasitic resistance and inductance between the dies and therefore allowing for a reduced dead time and increased efficiency of the converter. The integration of part of the driver on the same die as the power transistors of the converter can be implemented using the technology of the power transistors in an area of the die electrically isolated from the power transistors, e.g. by a dielectric-filled deep trench or other suitable structure.

According to an embodiment of a semiconductor die, the die comprises a semiconductor substrate having a first region and a second region isolated from the first region. A power transistor is disposed in the first region of the semiconductor substrate and has a gate, a source and a drain. A gate driver transistor which logically forms part of a driver is disposed in the second region of the semiconductor substrate and has a gate, a source and a drain. The gate driver transistor is electrically connected to the gate of the power transistor and operable to turn the power transistor off or on responsive to an externally-generated control signal received from the driver. A first contact pad is electrically connected to the source of the power transistor and a second contact pad is electrically connected to the drain of the power transistor. A third contact pad is electrically connected to the gate of the gate driver transistor for receiving the externally-generated control signal.

According to an embodiment of an integrated circuit, the integrated circuit comprises a first semiconductor die and a second semiconductor die. The first semiconductor die comprises control logic operable to generate a control signal, and part of a driver operable to control switching of a power transistor responsive to the control signal. The second semiconductor die comprises a semiconductor substrate having a first region and a second region isolated from the first region. A power transistor is disposed in the first region of the semiconductor substrate and has a gate, a source and a drain. A gate driver transistor is disposed in the second region of the semiconductor substrate and has a gate, a source and a drain. The gate driver transistor is electrically connected to the gate of the power transistor and operable to turn the power transistor off or on responsive to the control signal applied to the gate of the gate driver transistor. The gate driver transistor logically forms part of the driver. A first contact pad is electrically connected to the source of the power transistor, and a second contact pad is electrically connected to the drain of the power transistor. A third contact pad is electrically connected to the gate of the gate driver transistor for receiving the control signal from the first semiconductor die.

According to an embodiment of a method of manufacturing a semiconductor die, the method comprises: providing a semiconductor substrate having a first region and a second region isolated from the first region; forming a power transistor in the first region of the semiconductor substrate, the power transistor having a gate, a source and a drain; forming in the second region of the semiconductor substrate a gate driver transistor which logically forms part of a driver, the gate driver transistor having a gate, a source and a drain, the gate driver transistor being electrically connected to the gate of the power transistor and operable to turn the power transistor off or on responsive to an externally-generated control signal received from the driver; electrically connecting a first contact pad to the source of the power transistor; electrically connecting a second contact pad to the drain of the power transistor; and electrically connecting a third contact pad to the gate of the gate driver transistor for receiving the externally-generated control signal.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

According to embodiments described herein, at least the pull-down transistor of a driver final stage is monolithically integrated with power transistors of a DC-DC converter output stage on the same die. Such an integration avoids induced turn on of the low-side power transistor of the converter output stage, by reducing the parasitic inductance between the low-side transistor and the driver. One, more or all of the driver stages can be integrated in the output stage die. Other parts of the driver are disposed in a separate die. The DC-DC converter can have reduced dead time and increased efficiency since at least the pull-down transistor is removed from the driver die and disposed in the output stage die. The region of the converter output stage die that contains part of the driver stage is isolated from the region of the die that contains the converter power transistors to ensure proper operation. This isolation can be provided by a dielectric-filled deep trench or other suitable structure as described in more detail later herein.

Figure 1:
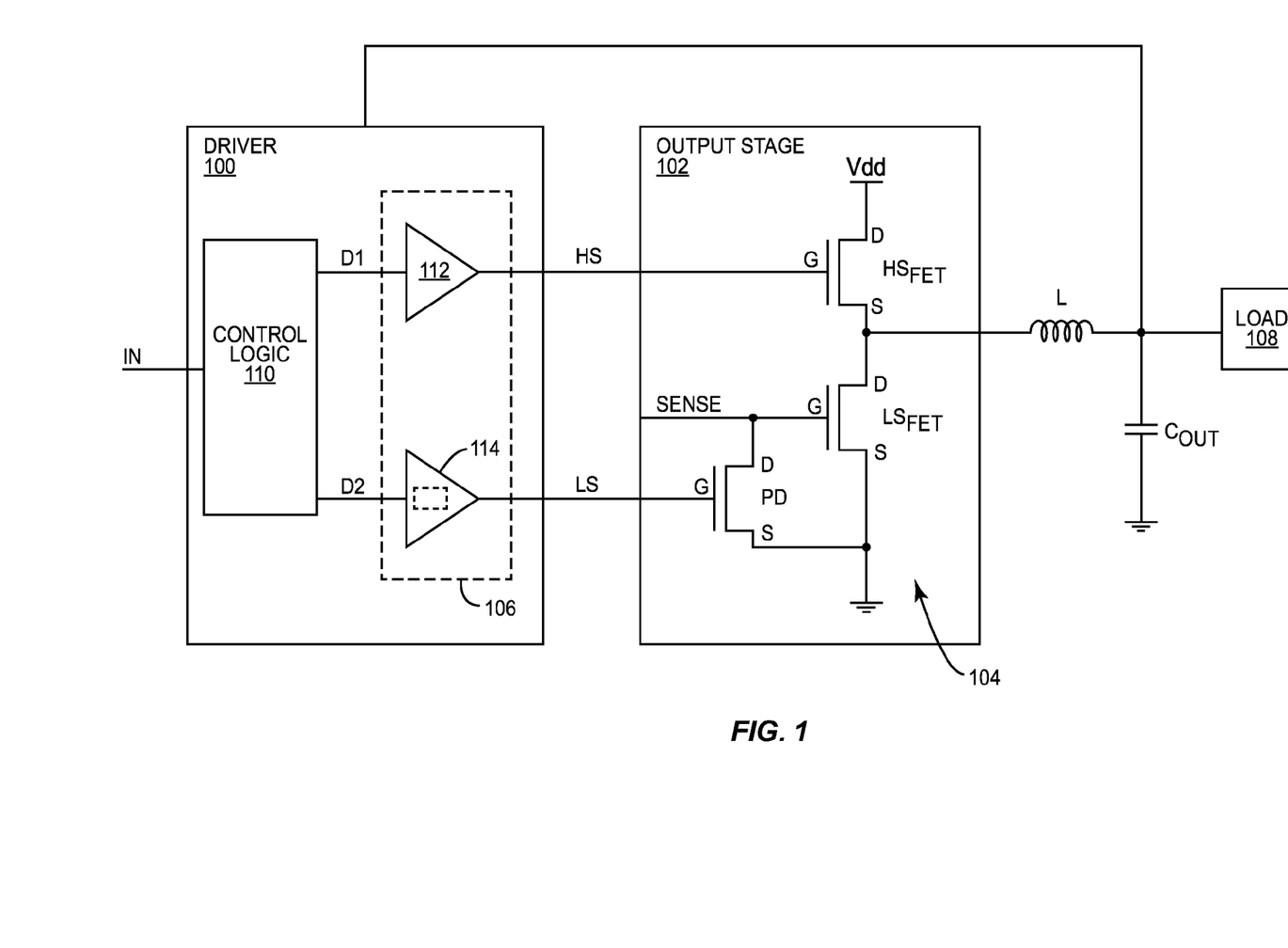
FIG. 1 illustrates a schematic diagram of a DC-DC converter integrated circuit.

FIG. 1 illustrates a schematic diagram of an embodiment of a DC-DC converter integrated circuit (IC). The DC-DC converter IC comprises first and second semiconductor dies (chips) 100, 102. The second die 102 includes an output stage 104 of the DC-DC converter, and the first die 100 includes part of a driver 106 for controlling switching of the output stage power transistors $HS_{FET}$, $LS_{FET}$ included in the second die 102. The output stage power transistors $HS_{FET}$, $LS_{FET}$ can be disposed in separate dies or the same die.

The second die 102 can include at least one pair of high-side and low-side power transistors $HS_{FET}$, $LS_{FET}$ such as power MOSFETs (metal oxide semiconductor field effect transistors). The drain of each high-side transistor $HS_{FET}$ is connected to a supply voltage (Vdd), and the source of each low-side transistor $LS_{FET}$ is connected to ground. The source of each high-side transistor $HS_{FET}$ and the drain of each low-side transistor $LS_{FET}$ are connected to a load 108 through a corresponding inductor (L) and an output capacitor (Cout). Each transistor pair $HS_{FET}$, $LS_{FET}$ provides phase current to the load 108. The high-side and low-side transistors $HS_{FET}$, $LS_{FET}$ are switched on and off at different times by the driver 106 so that a relatively stable voltage is provided to the load 108, regardless of load conditions. Part of the driver 106 is disposed in the first (driver) die 100. For example the driver die 100 can include control logic 110 for generating drive signals (D1, D2) in response to an input signal (IN), a physically complete driver 112 for generating a first control signal HS that controls the switching of the high-side transistor $HS_{FET}$ included in the second (output stage) die 102 responsive to the first drive signal D1 generated by the control logic 110, and a physically partial driver 114 for generating a second control signal LS that controls the switching of the low-side transistor $LS_{FET}$ included in the output stage die 102 responsive to the second drive signal D2 generated by the control logic 110. The controller for such a converter can be outside the package containing the components shown in FIG. 1 and electrically connected to each phase as is conventionally done, especially in the case of a multi-phase DC-DC converter.

Figure 2:
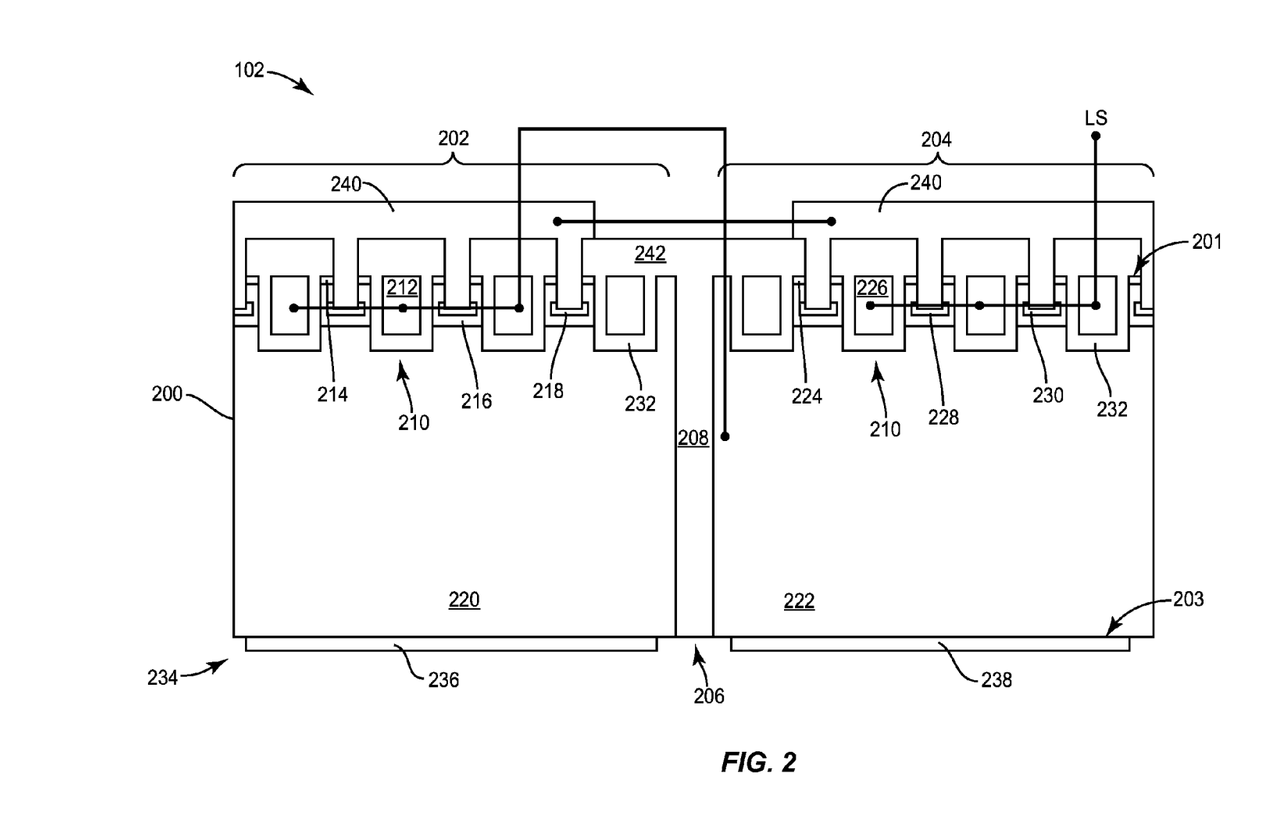
FIG. 2 illustrates a cross-sectional view of an output stage die of a DC-DC converter integrated circuit.

FIG. 2 shows a cross-sectional view of the output stage semiconductor die 102, which includes the high-side and/or low-side power transistors $HS_{FET}$, $LS_{FET}$ of the DC-DC converter IC. The output stage die 102 comprises a semiconductor substrate 200 having a first region 202 and a second region 204 isolated from the first region 202. Any type of semiconductor substrate 200 can be used, such as a silicon wafer, SiC wafer, GaN wafer, etc. As such, the power transistors $HS_{FET}$, $LS_{FET}$ of the output stage 104 can be monocrystalline or compound semiconductor devices. Transistor trenches 210 can be formed in both regions 202, 204 of the substrate 200 using the same layout and processes. Both can be easily varied if adjustments are needed because of the different functions of the different FETs. The first and second regions 202, 204 are isolated by a deep trench 206 filled with a dielectric 208, such as an oxide that extends between opposing main surfaces 201, 203 of the substrate 200. Other standard techniques can be used to isolate the first and second regions 202, 204 from one another.

The high-side and low-side transistors $HS_{FET}$, $LS_{FET}$ are disposed in the first region 202 of the semiconductor substrate 200. The high-side and low-side transistors $HS_{FET}$, $LS_{FET}$ each have a gate (G) 212, a source (S) 214, a body region 216 with a highly doped contact region 218, and a drain (D) 220. The high-side transistor $HS_{FET}$ is out of view in FIG. 2, and can have the same or different construction than the low-side transistor $LS_{FET}$. For example, the high-side transistor $HS_{FET}$ can be smaller than the low-side transistor $LS_{FET}$ if the duty cycle of the DC-DC converter is substantially less than 50%. For ease of description, FIG. 2 is described in the context of the $LS_{FET}$. However, the die regions and electrical connections described next can be for the $HS_{FET}$ instead of the $LS_{FET}$.

In general, at least a gate driver transistor of the physically partial driver included in the driver die is monolithically integrated in the second region of the output stage die. For example, a gate driver pull-down transistor (PD) of the physically partial driver 114 included in the driver die 100 can be monolithically integrated in the second region 204 of the output stage die 200 and electrically connected to the low-side transistor $LS_{FET}$ disposed in the first region 202 of the output stage die 200 as schematically illustrated in FIG. 1 and FIG. 2. Particularly according to this embodiment, the drain 222 of the pull-down transistor PD is connected to the gate 212 of the low-side transistor $LS_{FET}$ and the source 224 of the pull-down transistor PD is connected to the source 214 of the low-side transistor $LS_{FET}$. Such a direct connection between the drain 222 of the pull-down transistor PD and the gate 212 of the low-side transistor $LS_{FET}$ provides a low inductive short between gate and source when the device is switched off. Induced turn-on of the low-side power transistor $LS_{FET}$ becomes far less likely with such a configuration. As a result no additional switching margin (i.e. additional dead time) is needed to address induced turn-on, allowing for increased switching frequency of the DC-DC converter which in turn significantly increases the efficiency of the converter.

The drain 222 of the gate driver pull-down transistor PD can be connected to the gate 212 of the low-side transistor $LS_{FET}$ through a standard TSV (through silicon via) or a standard TSV combined with a structured backside metallization. Such a connection is out of view in FIG. 2. In general, the pull-down transistor PD turns the low-side transistor $LS_{FET}$ off or on responsive to the corresponding control signal (LS) applied to the gate 226 of the pull-down transistor PD. Like the low-side transistor $LS_{FET}$, the pull-down transistor PD also has a body region 228 with a highly doped contact region 230. The pull-down transistor PD integrated in the output stage die 102 logically completes the partial driver 114 included in the driver die 100 as indicated by the dashed box shown in FIG. 1, and receives control signal LS from the partial driver 114 included in the driver die 100.

In FIG. 2, the power transistors $HS_{FET}$, $LS_{FET}$ integrated in the output stage die 102 are vertical MOS devices in that the transistor gates 212 are disposed in trenches 210 formed in the semiconductor substrate 200 and insulated from the surrounding semiconductor material by a dielectric material 232. A vertical channel of the high-side and low-side transistors $HS_{FET}$, $LS_{FET}$ extends along each trench 210 in the semiconductor substrate 200 between the source and drain 214, 220 of the high-side and low-side transistors $HS_{FET}$, $LS_{FET}$. Further according to this embodiment, the gate driver pull-down transistor PD monolithically integrated in the output stage die 102 is an nMOS transistor that turns the low-side transistor $LS_{FET}$ off responsive to control signal LS received from the partial driver 114 included in the driver die 100. The pull-down transistor PD is also disposed in respective insulated trenches 210 formed in the semiconductor substrate 200, and has a vertical channel extending along the trenches 210 in the semiconductor substrate 200 between the source and drain 224, 222 of the pull-down transistor PD.

If the bulk of an area of the output stage die 102 can be isolated, a similar or the same process can be used as for the power transistors $HS_{FET}$, $LS_{FET}$ of the output stage 104 as the nMOS gate driver pull down transistor PD. This results in better performance of the pull down transistor PD and low process complexity for the combination. The integration of the nMOS is shown in FIG. 2. Both regions 202, 204 of the substrate 200 are not shorted via backside metallization 234 and/or the package (not shown). Instead, any metallization 234 at the backside 203 of the substrate 200 is patterned as shown in FIG. 2 to ensure proper isolation. Termination structures, fingers, additional electrodes, and other optimization structures are omitted for ease of illustration. In addition, the geometry of the transistor structures is not necessarily drawn to scale.

External electrical connections are provided to the transistors included in the output stage die 102 by contact pads. For example in FIG. 2 which shows the low-side transistor $LS_{FET}$ of the DC-DC converter output stage 104 and pull-down transistor PD of the driver 106, isolated contact pads 236, 238 can be provided at the backside 203 of the substrate 200 for the drains 220, 222 of both transistors $LS_{FET}$, PD.

Contact pad 238 is optional when the drain of the pull-down transistor PD is already connected to the power FET gate. An additional contact pad 240 can be provided at the front side 201 of the substrate 200 for the common source connection of the low-side and pull down transistors $LS_{FET}$, PD. This contact pad 240 is separated from the substrate 200 by a dielectric layer 242. The remaining contact pads are out of view in FIG. 2.

The circuit connections between the low-side transistor $LS_{FET}$ and the gate driver pull-down transistor PD are schematically shown in FIG. 2 i.e. the drain 222 of the pull-down transistor PD is electrically connected to the gate 212 of the low-side transistor $LS_{FET}$ and a separate electrical connection is provided to the gate 226 of the pull-down transistor PD to receive control signal LS from the partial driver 114 included in the driver die 100. An additional contact pad (labeled 'SENSE' in FIG. 1) can be provided for sensing the gate of the low-side transistor $LS_{FET}$. This contact pad is out of view in FIG. 2 and can be omitted.

Figure 3:
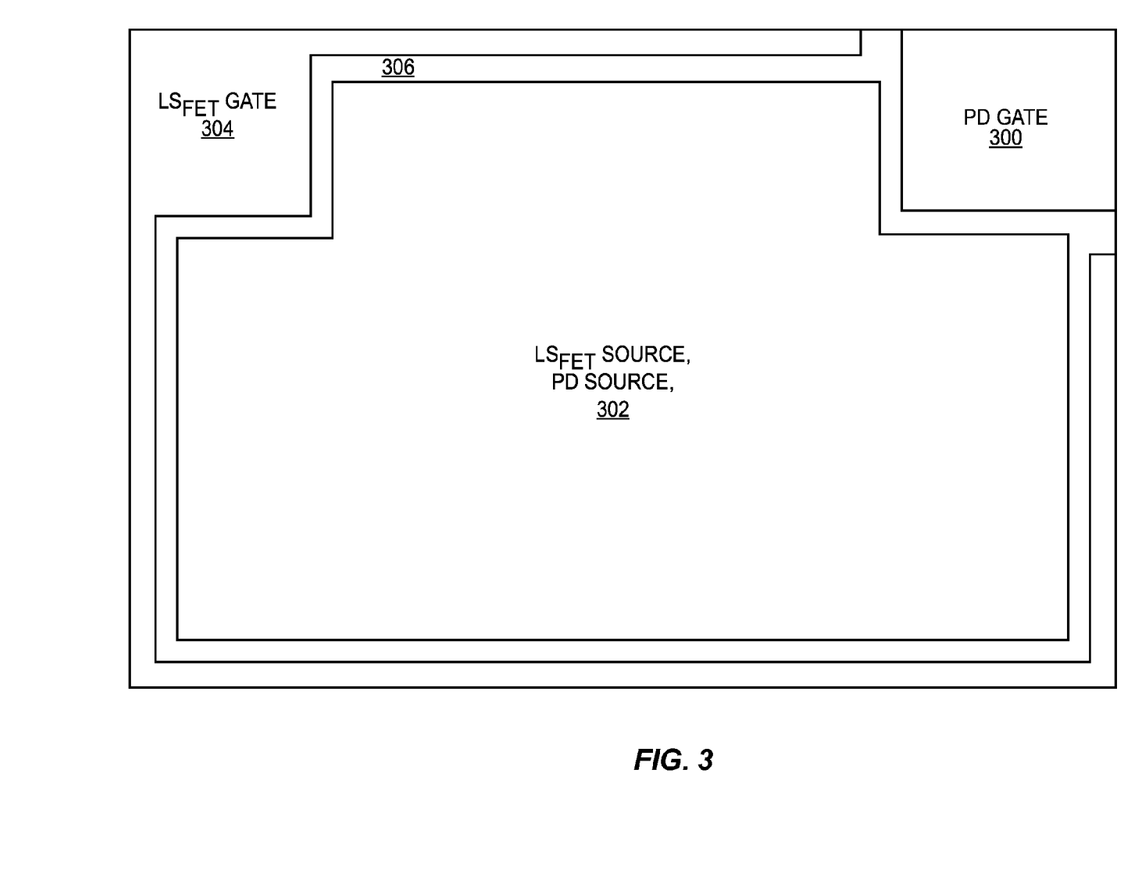
FIG. 3 illustrates a top-down plan view of a contact pad layout of a DC-DC converter output stage die.
Figure 4:
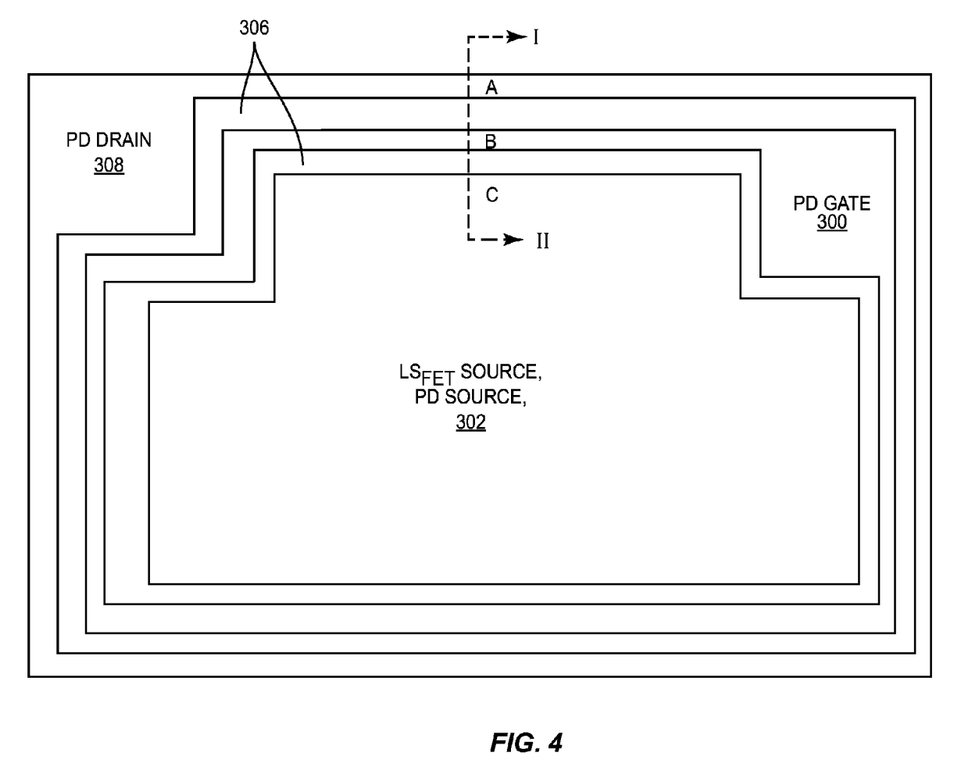
FIG. 4 illustrates a top-down plan view of another contact pad layout of a DC-DC converter output stage die.
Figure 5:
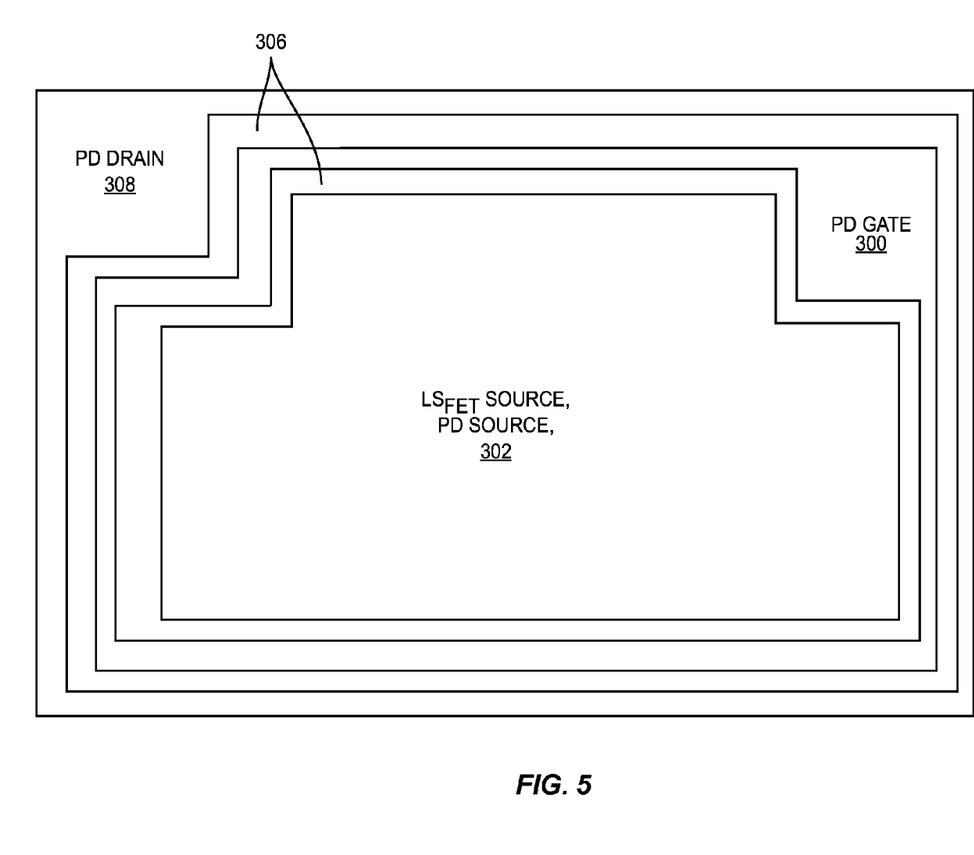
FIG. 5 illustrates a top-down plan view of yet another contact pad layout of a DC-DC converter output stage die.

FIG. 3 through 5 illustrate various embodiments of contact pad configurations for the low-side transistor $LS_{FET}$ of the DC-DC converter output stage 104 and the gate driver pull-down transistor PD of the driver 106. In FIG. 3, a first contact pad ('CPD Gate') 300 is disposed above the substrate 200 for providing an external electrical connection to the gate 226 of the gate driver pull-down transistor PD monolithically integrated in the second region 204 of the output stage die 102. The nMOS pull down transistor PD can be disposed under the first contact pad 300 in the second region 204 of the semiconductor substrate 200 if the area needed for a reasonable Rdson and reliable bonding are similar. In one embodiment, the gate river pull-down transistor PD has an Rdson of 500 mΩ or less. A second contact pad ($LS_{FET}$ Source, PD Source) 302 is also disposed above the substrate 200 for providing an external electrical connection to both sources 214, 224 of the pull-down transistor PD and the low-side transistor $LS_{FET}$ of the converter output stage 104. A third contact pad ($LS_{FET}$ Gate) 304 can also disposed above the substrate 200 for providing an optional external electrical connection to the gate 212 of the low-side power transistor $LS_{FET}$. This contact pad 304 can be omitted if sensing of the gate voltage of the low-side transistor $LS_{FET}$ is not required. The contact pads 300, 302, 304 are insulated from one another by a dielectric material 306.

FIG. 4 illustrates a similar contact pad layout embodiment as shown in FIG. 3. The contact pad 300 for the gate 226 of the gate driver pull-down transistor PD can have a larger area to withstand even higher current when charging the gate 226 of nMOS pull down transistor PD. Also, the contact pad 304 for the gate 212 of the low-side power transistor $LS_{FET}$ is disposed at the backside 203 of the substrate 200 instead of the front side 201 and therefore is out of view in FIG. 4. In this embodiment, the additional contact pad 308 shown in FIG. 4 is electrically connected to the drain 222 of the pull-down transistor PD. In this case, the pull-down transistor PD is a lateral device and the drain contact pad 308 for the pull-down transistor PD is electrically connected to the gate 212 of the low-side transistor $LS_{FET}$ e.g. by a TSV extending from the first main surface 201 of the substrate 200 to the opposing main surface 203.

FIG. 5 illustrates a similar contact pad layout embodiment as shown in FIG. 4, however, the contact pad 300 for the gate 226 of the gate driver pull-down transistor PD has an area between that of the corresponding contact pads 300 shown in FIGS. 3 and 4. Still other contact pad layouts are possible.

Drain contact pads for the vertical low-side transistor $LS_{FET}$ and optionally the gate driver pull-down transistor PD are provided at the backside 203 of the substrate 200 as previously described herein and, and therefore are out of view in FIGS. 3 through 5.

Figure 6:
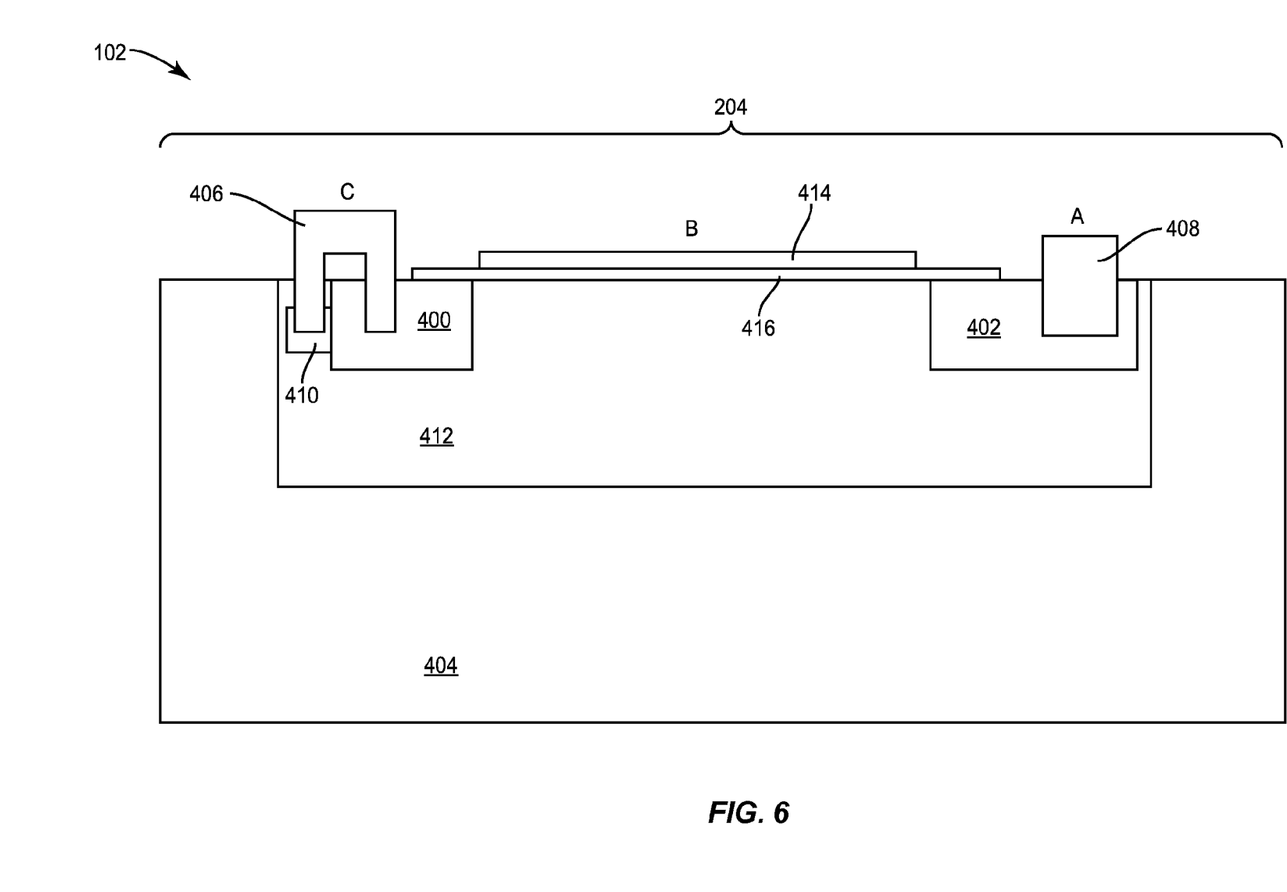
FIG. 6 illustrates a cross-sectional view of a lateral-channel driver stage transistor monolithically integrated in an output stage die of a DC-DC converter integrated circuit.

FIG. 6 illustrates a cross-sectional view of the output stage die 102 of the DC-DC converter in a region below the contact pad metallization, along the line labeled I-II in FIG. 4. According to this embodiment, the gate driver pull-down transistor PD monolithically integrated in the second region 204 of the output stage die 102 is a lateral MOSFET instead of a vertical channel device. As such, both the source and drain 400, 402 of the pull-down transistor PD are disposed at the same side of the substrate 404, and contacted by respective contacts 406, 408. The contact 406 at the source side can also be connected to a highly doped contact region 410 of the transistor body 412. The gate 414 of the pull-down transistor PD is insulated from the substrate 404 by a gate dielectric 416. Particular points of electrical connection are labeled 'A', 'B', and 'C' in FIG. 4 and FIG. 6.

Figure 7:
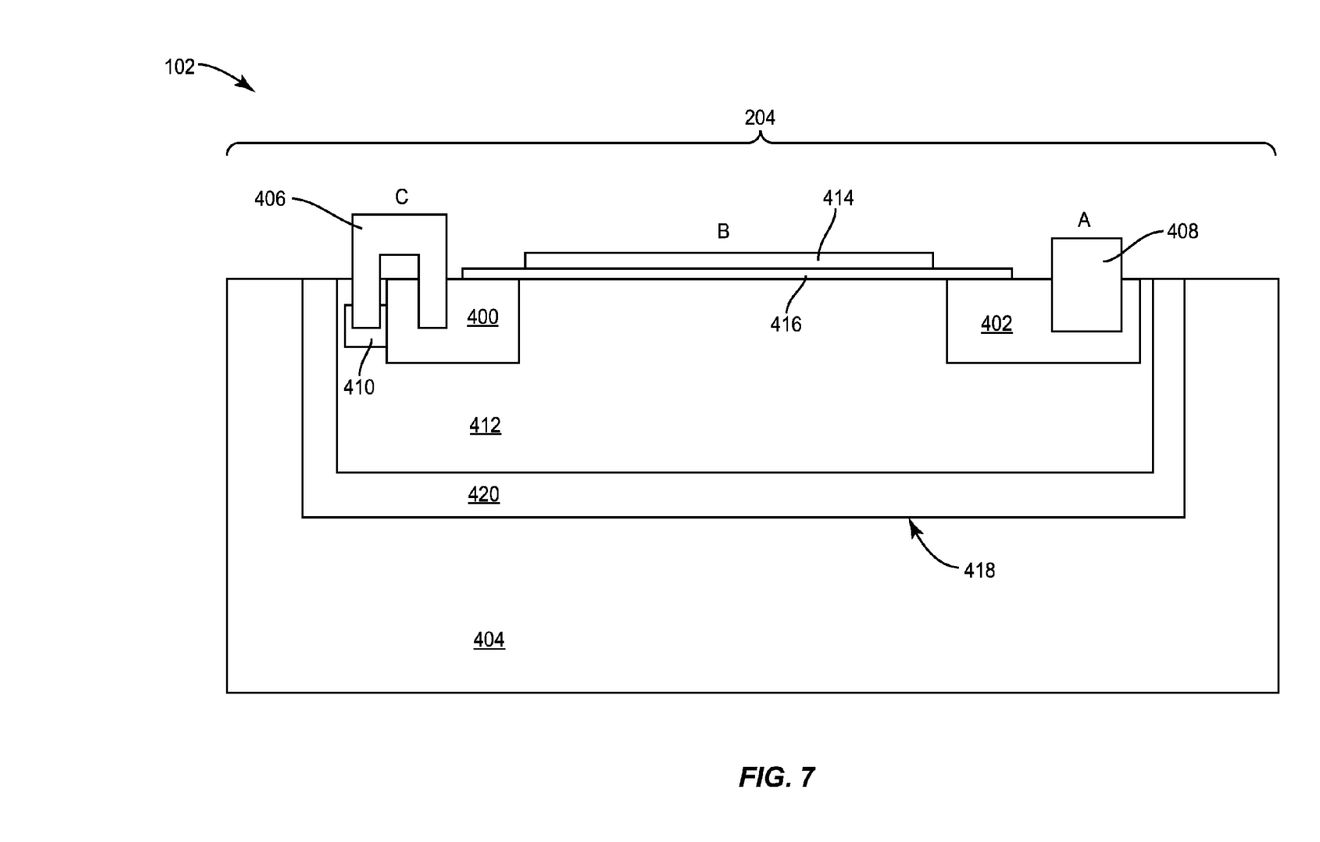
FIG. 7 illustrates a cross-sectional view of another lateral-channel driver stage transistor monolithically integrated in an output stage die of a DC-DC converter integrated circuit.

FIG. 7 illustrates a cross-sectional view of another embodiment of the output stage die 102 of the DC-DC converter in a region below the contact pad metallization, along the line labeled I-II in FIG. 4. The embodiment shown in FIG. 7 is similar to the one shown in FIG. 6, however, the lateral gate driver pull-down MOSFET PD is disposed in a trench 418. The sidewalls and bottom of the trench 418 are covered by a dielectric 420. Particular points of electrical connection are labeled 'A', 'B', and 'C' in FIG. 4 and FIG. 7.

Figure 8:
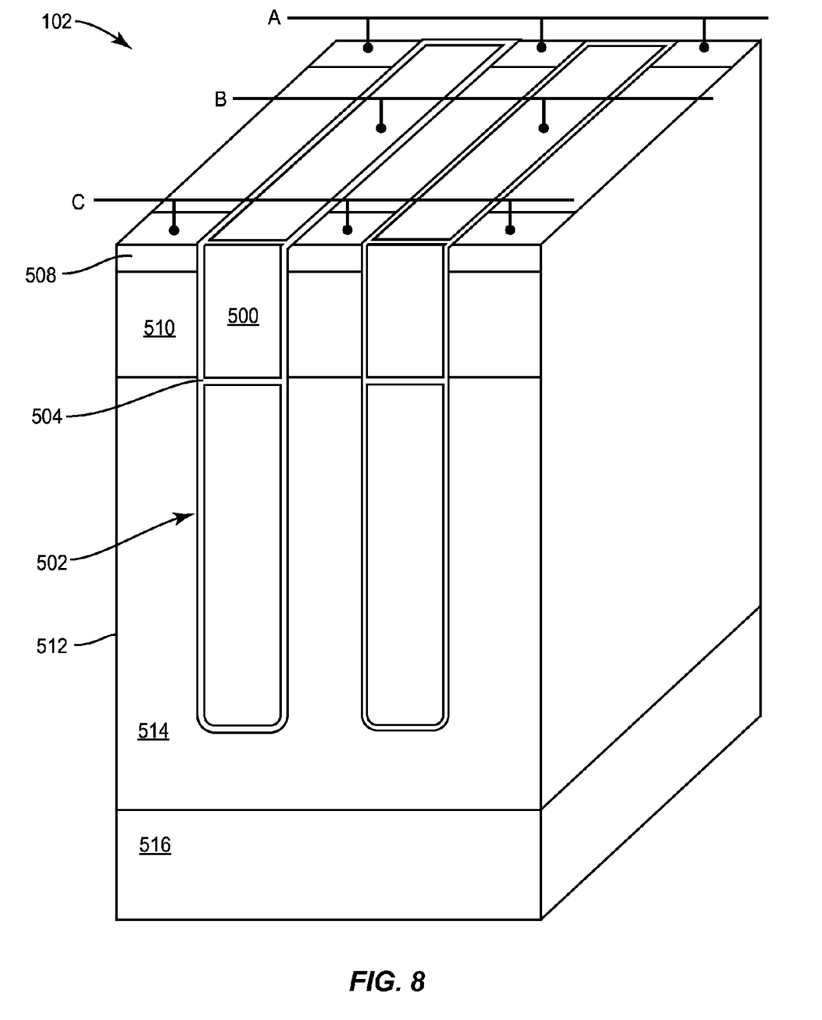
FIG. 8 illustrates a cross-sectional view of a vertical-channel driver stage transistor monolithically integrated in an output stage die of a DC-DC converter integrated circuit.

FIG. 8 illustrates a cross-sectional view of yet another embodiment of the output stage die 102 of the DC-DC converter in a region below the contact pad metallization, along the line labeled I-II in FIG. 4. According to this embodiment, the gate driver pull-down transistor PD monolithically integrated in the second region 204 of the output stage die 102 is an enhancement n-channel trench FET. Particularly, the gate 500 of the pull-down transistor PD is disposed in a trench 502 lined with a dielectric 504. A field electrode 506 can be provided below the gate electrode 500 in the trenches 502 and insulated from the gate electrode 500. The source 508 of the pull-down transistor PD is disposed in a body region 510 of the substrate 512. Below the body region 510 is a drift region 514, and below the drift region 514 is the drain 516 of the pull-down transistor PD. Particular points of electrical connection are labeled 'A', 'B', and 'C' in FIG. 4 and FIG. 8 where A=Drain and C=source or vice versa. Current flows from C to A. Optional field plates block the drain potential from the power FET from entering the active region of the pull-down transistor PD.

Figure 9:
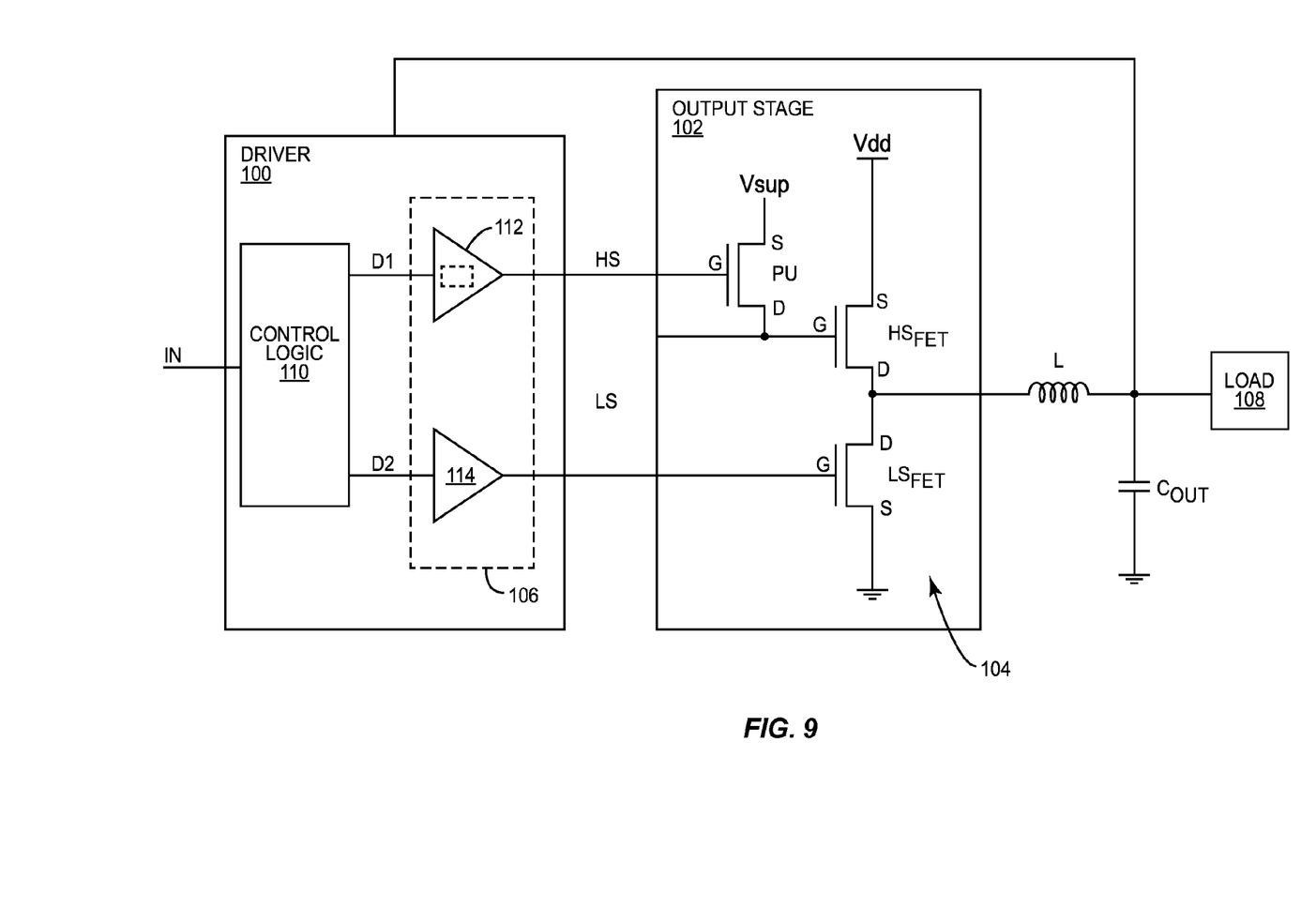
FIG. 9 illustrates a schematic diagram of another DC-DC converter integrated circuit.

FIG. 9 illustrates a schematic diagram of another embodiment of the DC-DC converter integrated circuit (IC). The DC-DC converter IC of FIG. 9 is similar to the one shown in FIG. 1, however, the output stage die 102 includes a gate driver pull-up transistor (PU) of the driver 106 for the high-side power transistor $HS_{FET}$ instead of the gate driver pull-down transistor PD for the low-side power transistor $LS_{FET}$. The gate driver pull-up transistor PU can also be used at the low-side power transistor $LS_{FET}$ alternatively or in addition to the high-side power transistor $HS_{FET}$. In the exemplary circuit of FIG. 9, it is the low-side driver stage 114 that is physically complete in the driver die 100. The high-side driver stage 112 is only partially physically complete in the driver die 100. The gate driver pull-up transistor PU of the high-side driver stage 112 is disposed in the output stage die 102 and electrically connected to the high-side power transistor $HS_{FET}$ of the converter output stage 104 as shown in FIG. 9. The pull-up transistor PU connects the high-side transistor $HS_{FET}$ to a supply voltage Vsup e.g. via a bootstrap circuit (not shown) responsive to control signal HS applied to the gate of the pull-up transistor PU. The pull-up transistor PU integrated in the output stage die 102 logically completes the partial high-side driver stage 112 included in the driver die 100 as indicated by the dashed box shown in FIG. 9, and receives control signal HS from the partial high-side driver stage 112. The pull-up transistor PU is disposed in a different region of a semiconductor substrate of the output stage die 102 than the power transistors $HS_{FET}$, $LS_{FET}$ as previously described herein with regard to the gate driver pull-down transistor PD, ensuring proper operation of the DC-DC converter.

Figure 10:
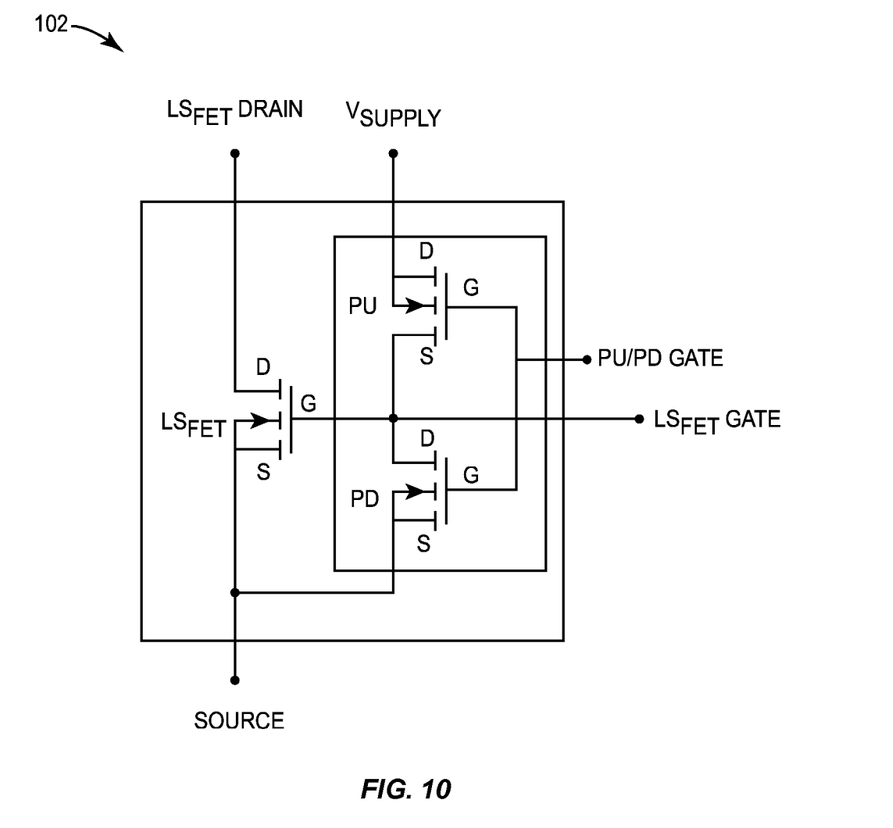
FIG. 10 illustrates a schematic diagram of a DC-DC converter output stage die.

FIG. 10 illustrates a schematic diagram of another embodiment of the output stage die 102 of the DC-DC converter IC. According to this embodiment, both the pull-down and pull-up transistors PD, PU of the low-side and/or high-side driver stage 114, 112 are monolithically integrated in the output stage die 102. The various external contact connections to the low-side power transistor $LS_{FET}$ and the gate driver pull-down and pull-up transistors PD, PU are illustrated in FIG. 10 with blocks. The drain contact pad for the low-side power transistor $LS_{FET}$ is labeled '$LS_{FET}$ Drain', the shared source contact pad for the low-side power transistor $LS_{FET}$ and the gate driver pull-down and pull-up transistors PD, PU is labeled 'Source', the supply voltage contact pad for the gate driver pull-up transistor PU is labeled '$V_{supply}$', the gate contact pad for the pull-down and pull-up transistors PD, PU is labeled 'PU/PD Gate', and the optional gate contact pad for the low-side power transistor $LS_{FET}$ is labeled '$LS_{FET}$ Gate'.

Figure 11:
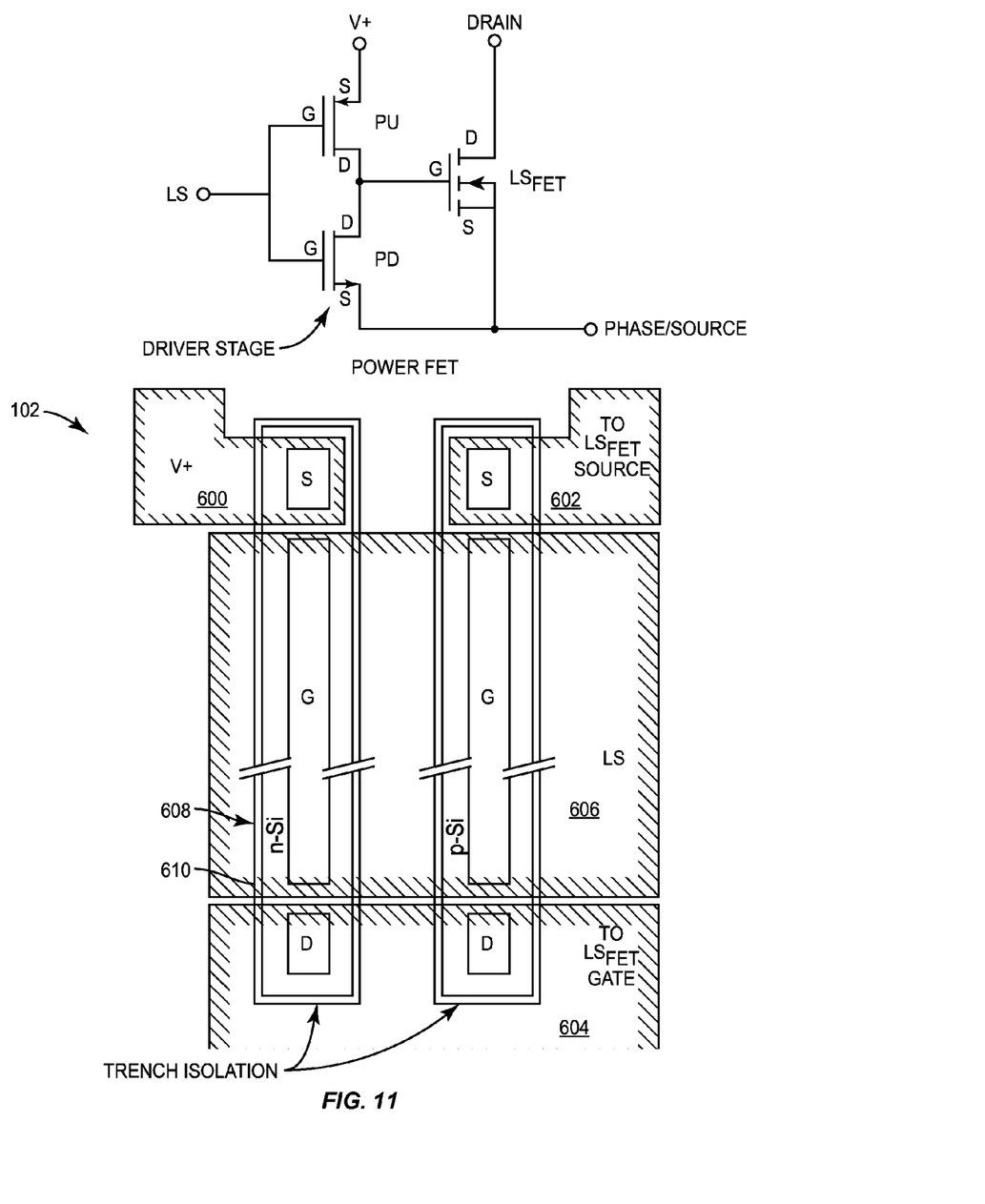
FIG. 11 illustrates a schematic diagram of a final driver stage connected to a power transistor of a DC-DC converter integrated circuit, and a corresponding top-down plan view of the die in which the transistors are monolithically integrated.

FIG. 11 illustrates another embodiment of the pull-down and pull-up transistors PD, PU of the low-side driver stage 114 monolithically integrated in the output stage die 102. The upper part of FIG. 11 schematically shows the electrical connections between the pull-down and pull-up transistors PD, PU and the low-side power transistor $LS_{FET}$. The remainder of FIG. 11 partly shows a physical implementation of the pull-down and pull-up transistors PD, PU and the corresponding electrical connections which are formed in a metal layer above the semiconductor substrate. The source (S) of the pull-up transistor PU is connected to a positive supply voltage V+ by a first metal region 600. The source (S) of the pull-down transistor PD is connected to the source of the low-side power transistor $LS_{FET}$ by a second metal region 602. The drains (D) of the pull-up and pull-down transistors PU, PD are connected together and to the gate of the low-side power transistor $LS_{FET}$ by a third metal region 604. The gates (G) of the pull-up and pull-down transistors PU, PD are connected together to control signal input LS generated by the driver die 100 by a forth metal region 606. According to this embodiment, the source, drain and gate of the pull-up and pull-down transistors PU, PD are disposed in a trench 608, e.g. in the edge region of the output stage die 102. A trench isolation dielectric 610 is disposed on the sidewalls and bottom of the trench 608, i.e. the pull-up and pull-down transistors PU, PD are lateral devices.

Figure 12:
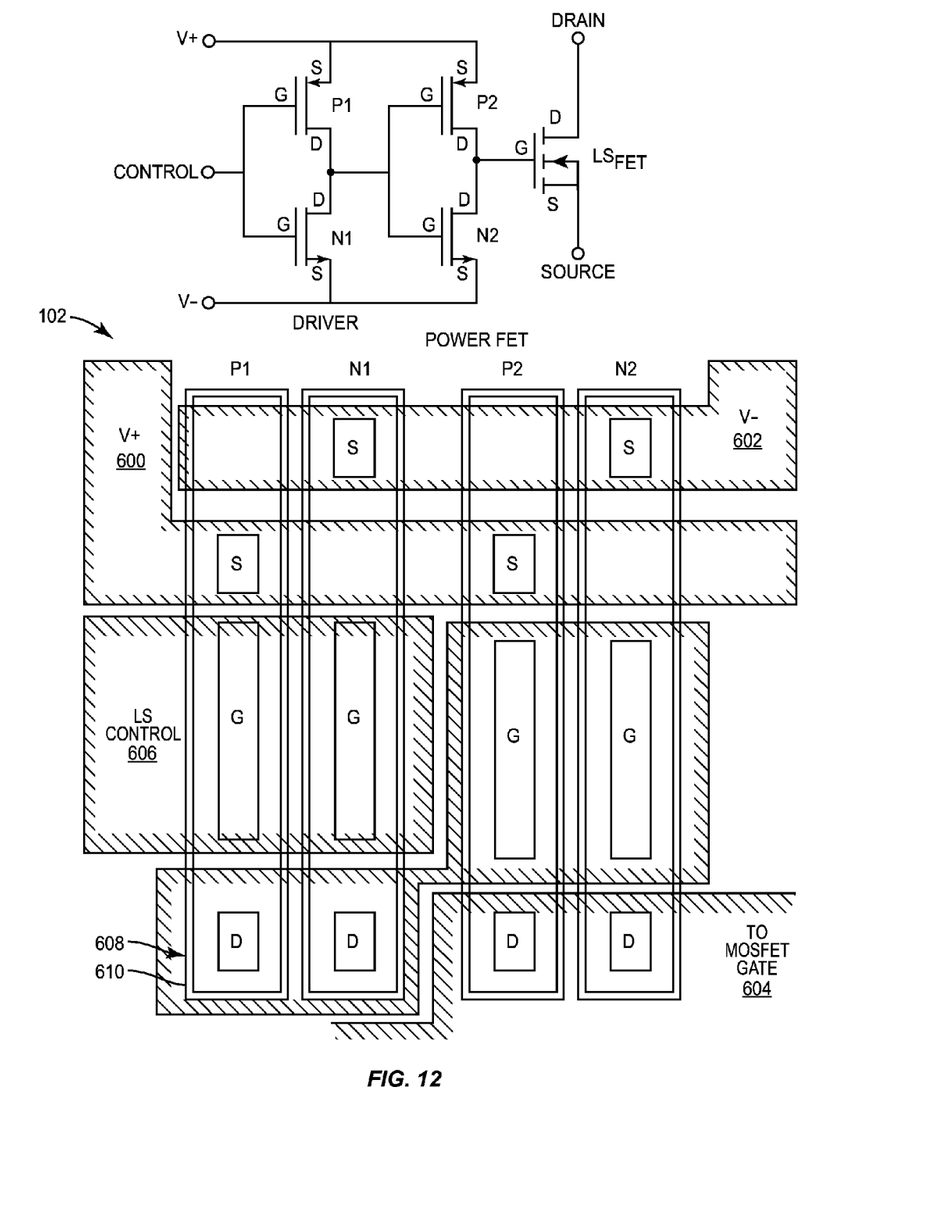
FIG. 12 illustrates a schematic diagram of a multi-stage driver connected to a power transistor of a DC-DC converter integrated circuit, and a corresponding top-down plan view of the die in which the transistors are monolithically integrated.

FIG. 12 illustrates yet another embodiment of the pull-down and pull-up transistors PD, PU of the low-side driver stage 114 monolithically integrated in the output stage die 102. According to this embodiment, the low-side transistor driver 114 has at least two stages, each stage including a pull-up transistor (Px) and a pull-down transistor (Nx). The upper part of FIG. 12 schematically shows the electrical connections between the pull-down and pull-up transistors Px, Nx of the multi-stage low-side driver 114, and between the multi-stage driver 114 and the low-side power transistor LS$_{FET}$. The remainder of FIG. 12 partly shows a physical implementation of the pull-down and pull-up transistors Px, Nx of the multi-stage driver 114, and the corresponding electrical connections formed between the pull-down and pull-up transistors Px, Nx of the multi-stage driver 114 and the low-side power transistor LS$_{FET}$ in one or more metal layers above a semiconductor substrate. According to this embodiment, the source, drain and gate of the pull-up and pull-down transistors Px, Nx are disposed in a trench 608, e.g. in the edge region of the output stage die 102. A trench isolation dielectric, 610 is disposed on the sidewalls and bottom of the trench 608, i.e. the pull-up and pull-down transistors Px, Nx are lateral devices.

A method of manufacturing the output stage die comprises providing a semiconductor substrate having a first region and a second region isolated from the first region, forming the low-side power transistor in the first region of the semiconductor substrate, forming the gate driver transistor in the second region of the semiconductor substrate, electrically connecting a first contact pad to the source of the power transistor, electrically connecting a second contact pad to the drain of the power transistor, and electrically connecting a third contact pad to the gate of the gate driver transistor for receiving the externally-generated control signal.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor die, comprising:
   a semiconductor substrate having a first region and a second region isolated from the first region;
   a power transistor disposed in the first region of the semiconductor substrate and having a gate, a source and a drain;
   a gate driver transistor disposed in the second region of the semiconductor substrate and having a gate, a source and a drain, the gate driver transistor logically forming part of a driver and being electrically connected to the gate of the power transistor and operable to turn the power transistor off or on responsive to an externally-generated control signal received from the driver;
   a first contact pad electrically connected to the source of the power transistor;
   a second contact pad electrically connected to the drain of the power transistor; and
   a third contact pad electrically connected to the gate of the gate driver transistor for receiving the externally-generated control signal.

2. The semiconductor die of claim 1, wherein the gate of the power transistor is disposed in a trench formed in the semiconductor substrate and has a vertical channel extending along the trench in the semiconductor substrate.

3. The semiconductor die of claim 1, wherein the gate driver transistor is an nMOS transistor operable to turn the power transistor off responsive to the externally-generated control signal.

4. The semiconductor die of claim 3, wherein the gate of the power transistor is electrically connected to the drain of the nMOS transistor and the source of the power transistor is electrically connected to the source of the nMOS transistor.

5. The semiconductor die of claim 3, wherein the nMOS transistor has a drain-to-source on-state resistance of 500 mΩ or less.

6. The semiconductor die of claim 1, wherein the gate driver transistor is disposed in a trench formed in the semiconductor substrate and has a vertical channel extending along the trench in the semiconductor substrate.

7. The semiconductor die of claim 1, wherein the first and third contact pads are electrically isolated from one another at a first side of the semiconductor die and the second contact pad is disposed at a second side of the semiconductor die opposing the first side.

8. The semiconductor die of claim 7, wherein the gate driver transistor is disposed under the third contact pad in the second region of the semiconductor substrate.

9. The semiconductor die of claim 7, further comprising a fourth contact pad electrically isolated from the first and third contact pads at the first side of the semiconductor die, the fourth contact pad being electrically connected to the gate of the power transistor.

10. The semiconductor die of claim 1, wherein the first and second regions of the semiconductor substrate are isolated from one another by an insulation-filled trench extending from a first side of the semiconductor substrate to a second side of the semiconductor substrate opposing the first side.

11. The semiconductor die of claim 10, wherein:
   the gate of the power transistor is disposed in a trench formed in the first region of the semiconductor substrate;
   the gate of the gate driver transistor is disposed in a trench formed in the second region of the semiconductor substrate;
   the first and third contact pads are electrically isolated from one another at the first side of the semiconductor substrate; and
   the second contact pad contacts the drain of the power transistor at the second side of the semiconductor substrate, and is electrically isolated from the second region of the semiconductor substrate.

12. The semiconductor die of claim 11, wherein the gate driver transistor is an nMOS transistor, the first contact pad is electrically connected to the source of the power transistor and the source of the nMOS transistor at the first side of the semiconductor substrate, and the gate of the power transistor is electrically connected to the drain of the nMOS transistor.

13. An integrated circuit, comprising:
   a first semiconductor die comprising control logic operable to generate a control signal and part of a driver operable to control switching of a power transistor responsive to the control signal; and a second semiconductor die, comprising:
- a semiconductor substrate having a first region and a second region isolated from the first region;
- a power transistor disposed in the first region of the semiconductor substrate and having a gate, a source and a drain;
- a gate driver transistor disposed in the second region of the semiconductor substrate and having a gate, a source and a drain, the gate driver transistor being electrically connected to the gate of the power transistor and operable to turn the power transistor off or on responsive to the control signal applied to the gate of the gate driver transistor, the gate driver transistor logically forming the other part of the driver;
- a first contact pad electrically connected to the source of the power transistor;
- a second contact pad electrically connected to the drain of the power transistor; and
- a third contact pad electrically connected to the gate of the gate driver transistor for receiving the control signal from the first semiconductor die.

14. The integrated circuit of claim 13, wherein the gate of the power transistor is disposed in a trench formed in the semiconductor substrate and has a vertical channel extending along the trench in the semiconductor substrate.

15. The integrated circuit of claim 13, wherein the gate driver transistor is an nMOS transistor operable to turn the power transistor off responsive to the control signal received from the first semiconductor die.

16. The integrated circuit of claim 15, wherein the gate of the power transistor is electrically connected to the drain of the nMOS transistor and the source of the power transistor is electrically connected to the source of the nMOS transistor.

17. The integrated circuit of claim 13, wherein the gate driver transistor is disposed in a trench formed in the semiconductor substrate and has a vertical channel extending along the trench in the semiconductor substrate.

18. The integrated circuit of claim 13, wherein the first and third contact pads are electrically isolated from one another at a first side of the second semiconductor die and the second contact pad is disposed at a second side of the second semiconductor die opposing the first side.

19. The integrated circuit of claim 18, wherein the gate driver transistor is disposed under the third contact pad in the second region of the semiconductor substrate.

20. The integrated circuit of claim 18, further comprising a fourth contact pad electrically isolated from the first and third contact pads at the first side of the second semiconductor die, the fourth contact pad being electrically connected to the gate of the power transistor.

21. The integrated circuit of claim 13, wherein the first and second regions of the semiconductor substrate are isolated from one another by an insulation-filled trench extending from a first side of the semiconductor substrate to a second side of the semiconductor substrate opposing the first side.

22. The integrated circuit of claim 21, wherein:
- the gate of the power transistor is disposed in a trench formed in the first region of the semiconductor substrate;
- the gate of the gate driver transistor is disposed in a trench formed in the second region of the semiconductor substrate;
- the first and third contact pads are electrically isolated from one another at the first side of the semiconductor substrate; and
- the second contact pad contacts the drain of the power transistor at the second side of the semiconductor substrate, and is electrically isolated from the second region of the semiconductor substrate.

23. The integrated circuit of claim 22, wherein the gate driver transistor is an nMOS transistor, the first contact pad is electrically connected to the source of the power transistor and the source of the nMOS transistor at the first side of the semiconductor substrate, and the gate of the power transistor is electrically connected to the drain of the nMOS transistor.

24. A method of manufacturing a semiconductor die, the method comprising:
- providing a semiconductor substrate having a first region and a second region isolated from the first region;
- forming a power transistor in the first region of the semiconductor substrate, the power transistor having a gate, a source and a drain;
- forming a gate driver transistor in the second region of the semiconductor substrate, the gate driver transistor having a gate, a source and a drain, the gate driver transistor logically forming part of a driver and being electrically connected to the gate of the power transistor and operable to turn the power transistor off or on responsive to an externally-generated control signal received from the driver;
- electrically connecting a first contact pad to the source of the power transistor;
- electrically connecting a second contact pad to the drain of the power transistor; and
- electrically connecting a third contact pad to the gate of the gate driver transistor for receiving the externally-generated control signal.

* * * * *